US012598720B2

(12) United States Patent
Geng et al.

(10) Patent No.: US 12,598,720 B2
(45) Date of Patent: Apr. 7, 2026

(54) SERVER DEVICE AND REMOVAL METHOD OF GRAPHICS CARD ASSEMBLY

(71) Applicants: SQ TECHNOLOGY(SHANGHAI) CORPORATION, Shanghai (CN); INVENTEC CORPORATION, Taipei City (TW)

(72) Inventors: Zhao Geng, Shanghai City (CN); Guang-Zhao Tian, Shanghai City (CN); Wei Wang, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 152 days.

(21) Appl. No.: 18/747,035

(22) Filed: Jun. 18, 2024

(65) Prior Publication Data

US 2025/0380373 A1     Dec. 11, 2025

(30) Foreign Application Priority Data

Jun. 5, 2024    (CN) .......................... 202410727637.4

(51) Int. Cl.
*H05K 7/14*          (2006.01)

(52) U.S. Cl.
CPC .................................. *H05K 7/1487* (2013.01)

(58) Field of Classification Search
CPC .................................................... H05K 7/1487
See application file for complete search history.

(56) References Cited

U.S. PATENT DOCUMENTS

2023/0063239 A1* 3/2023 Huang .................... G06F 1/186
2024/0310883 A1* 9/2024 Huang .................... G06F 1/185

* cited by examiner

*Primary Examiner* — Jerry Wu
(74) *Attorney, Agent, or Firm* — Maschoff Brennan

(57) ABSTRACT

A server device includes a chassis and a graphics card assembly. The graphics card assembly is movably disposed in the chassis, and includes a first side plate, a second side plate and at least one first handle installation portion. The first side plate is located opposite to the second side plate. The at least one first handle installation portion is located at the first side plate.

7 Claims, 14 Drawing Sheets

13

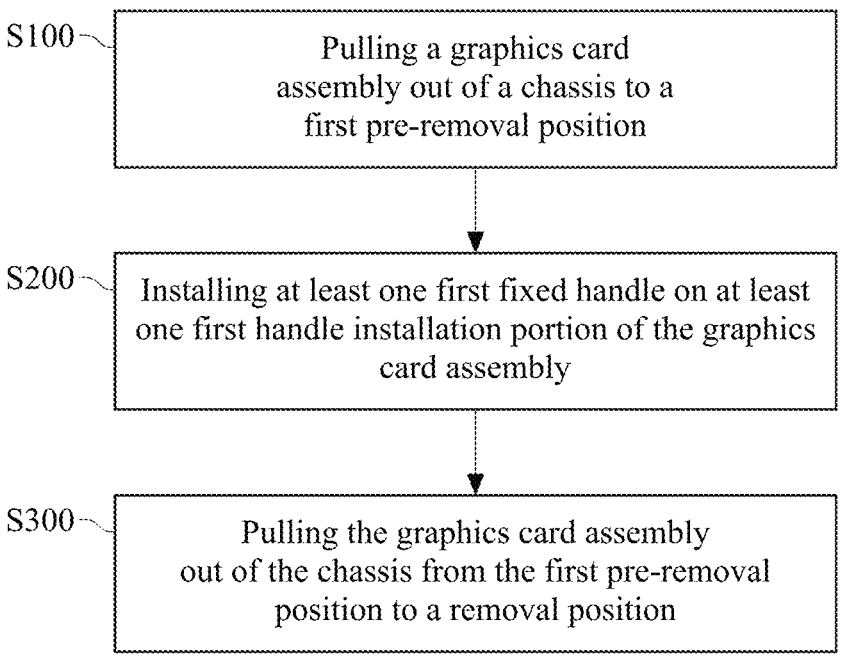

S100 — Pulling a graphics card assembly out of a chassis to a first pre-removal position S200 — Installing at least one first fixed handle on at least one first handle installation portion of the graphics card assembly S300 — Pulling the graphics card assembly out of the chassis from the first pre-removal position to a removal position

FIG. 13

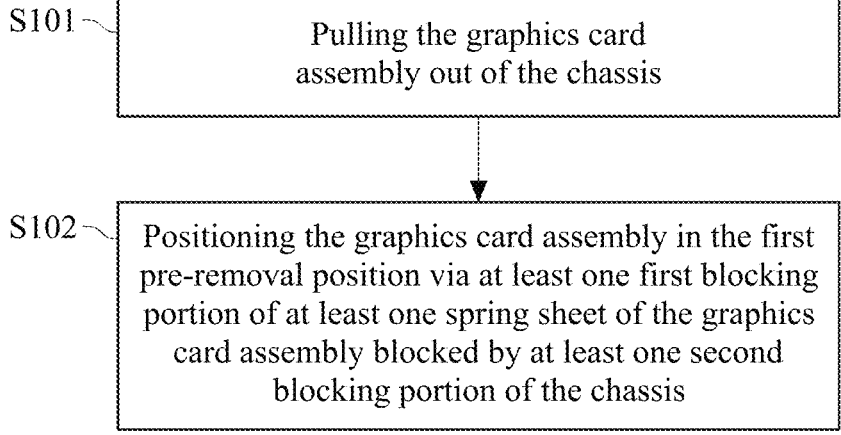

S101 — Pulling the graphics card assembly out of the chassis

S102 — Positioning the graphics card assembly in the first pre-removal position via at least one first blocking portion of at least one spring sheet of the graphics card assembly blocked by at least one second blocking portion of the chassis

FIG. 14

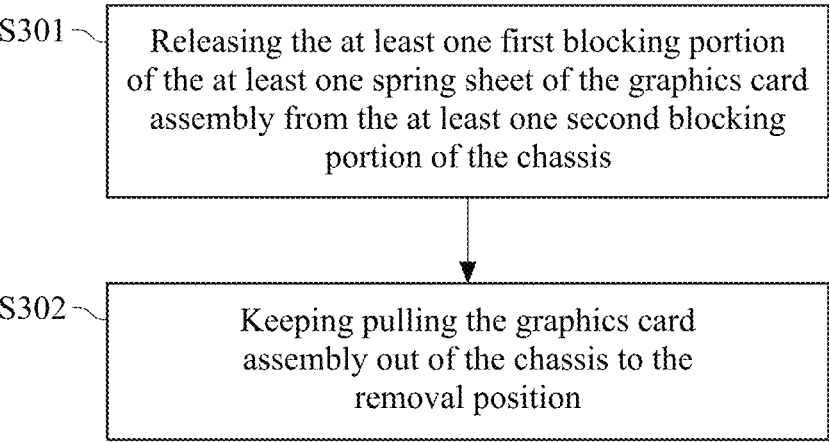

S301 — Releasing the at least one first blocking portion of the at least one spring sheet of the graphics card assembly from the at least one second blocking portion of the chassis S302 — Keeping pulling the graphics card assembly out of the chassis to the removal position

FIG. 15

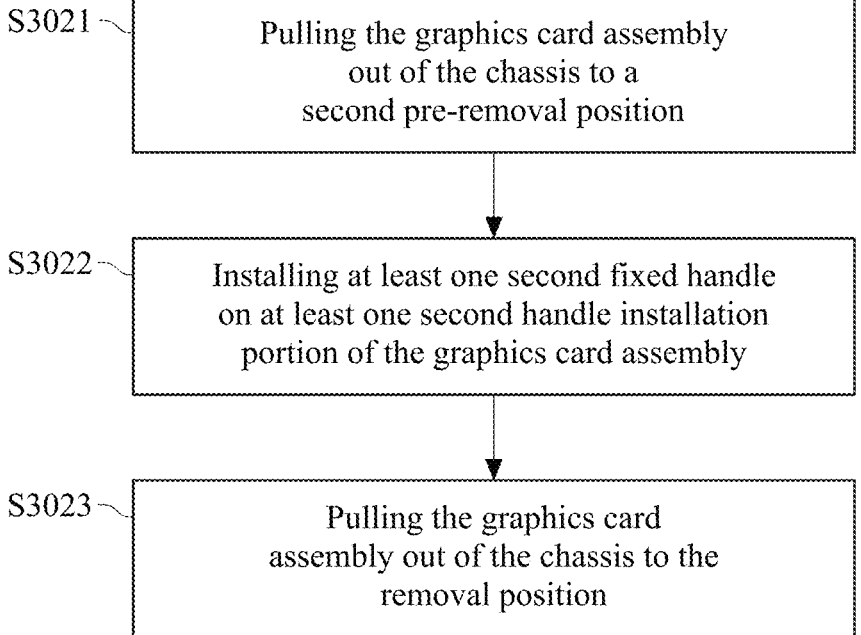

S3021 — Pulling the graphics card assembly out of the chassis to a second pre-removal position S3022 — Installing at least one second fixed handle on at least one second handle installation portion of the graphics card assembly S3023 — Pulling the graphics card assembly out of the chassis to the removal position

FIG. 16

SERVER DEVICE AND REMOVAL METHOD OF GRAPHICS CARD ASSEMBLY

CROSS-REFERENCE TO RELATED APPLICATIONS

This non-provisional application claims priority under 35 U.S.C. § 119(a) on Patent Application No(s). 202410727637.4 filed in China, on Jun. 5, 2024, the entire contents of which are hereby incorporated by reference.

BACKGROUND OF THE INVENTION

Technical Field of the Invention

The invention relates to a server device, more particularly to a server device including handle installation portions.

Description of the Related Art

Nowadays, with the rapid development of technology, most of enterprises may deal with various business (e.g., storing data, files and information) via a server for improving work efficiency.

Since users require the server to have higher performance, the server may include much more electronic components, and thus the server is heavier. Generally, manufacturers may install handles on each electronic assembly of the server, so that the users can easily remove the electronic assemblies. However, the positions of the handles disposed on the electronic assemblies are difficult to be adjusted. Accordingly, the handles may interfere with other components disposed in the server easily, thereby causing the inconvenience of removal and installation of the electronic assemblies in the server. Therefore, how to address the aforementioned issue is one of topics in this field.

SUMMARY OF THE INVENTION

The invention provides a server device and a removal method of graphics card assembly which facilitate the convenience of removal and installation of the graphics card assembly.

One embodiment of the invention provides a server device, and the server device includes a chassis and a graphics card assembly. The graphics card assembly is movably disposed in the chassis, and includes a first side plate, a second side plate and at least one first handle installation portion. The first side plate is located opposite to the second side plate. The at least one first handle installation portion is located at the first side plate.

Another embodiment of the invention provides a removal method of graphics card assembly, and the disassembling method of graphics card assembly includes pulling a graphics card assembly out of a chassis to a first pre-removal position, installing at least one first fixed handle on at least one first handle installation portion of the graphics card assembly and pulling the graphics card assembly out of the chassis from the first pre-removal position to a removal position.

According to the server device and the removal method of graphics card assembly disclosed by the above embodiments, the graphics card assembly includes the first handle installation portions and the second handle installation portions, and the first handle installation portions and the second handle installation portions are configured for the first fixed handles and the second fixed handles to be detachably disposed thereon, respectively. Therefore, the graphics card assembly can be removed and installed more easily via the first fixed handles disposed on the first handle installation portions and the second fixed handles disposed on the second handle installation portions during the process of removal and installation of the graphics card assembly. In addition, the first fixed handles and the second fixed handles may not interfere with other components disposed in the chassis. Accordingly, the graphics card assembly can be disposed in the chassis more easily, thereby improving the convenience of removal and installation of the graphics card assembly.

BRIEF DESCRIPTION OF THE DRAWINGS

The invention will become more fully understood from the detailed description given herein below and the accompanying drawings which are given by way of illustration only and thus are not limitative of the invention and wherein:

FIG. 13 is a flow chart of a removal method of graphics card assembly in accordance with an embodiment of the invention;

FIG. 14 is a flow chart of a step of pulling the graphics card assembly out of the chassis to a first pre-removal position of the removal method of graphics card assembly in FIG. 13;

FIG. 15 is a flow chart of a step of pulling the graphics card assembly out of the chassis from the first pre-removal position to a removal position of the removal method of graphics card assembly in FIG. 13; and FIG. 16 is a flow chart of a step of keeping pulling the graphics card assembly out of the chassis to the removal position of the removal method of graphics card assembly in FIG. 13.

DETAILED DESCRIPTION

Figure 1:
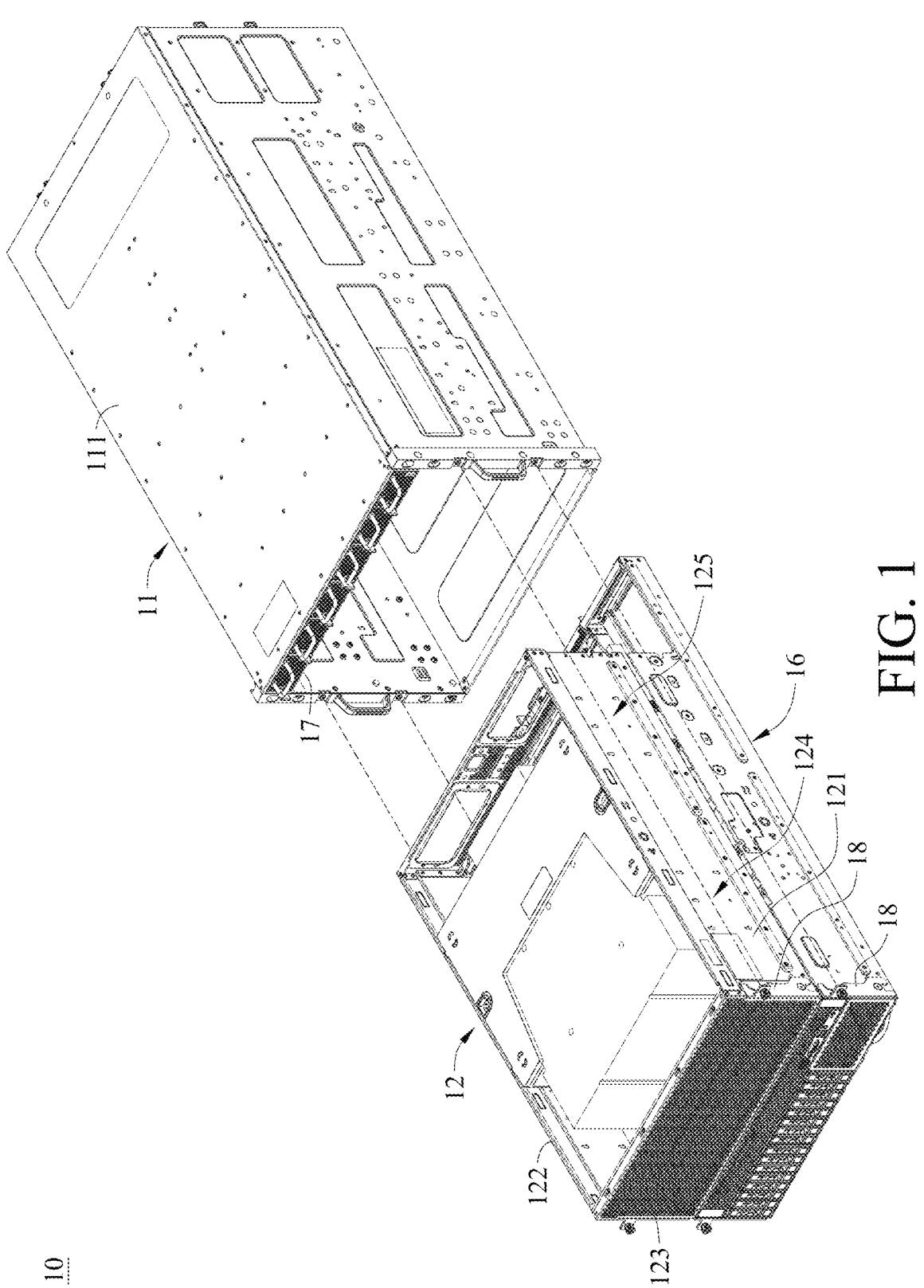
FIG. 1 is an exploded view of a server device without fixed handles in accordance with an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the invention, such as technical and scientific terms, have its own meanings and can be comprehended by those skilled in the art, unless the terms are additionally defined in the invention. That is, the terms used in the following paragraphs should be read on the meaning commonly used in the related fields and will not be overly explained, unless the terms have a specific meaning in the invention.

Figure 2:
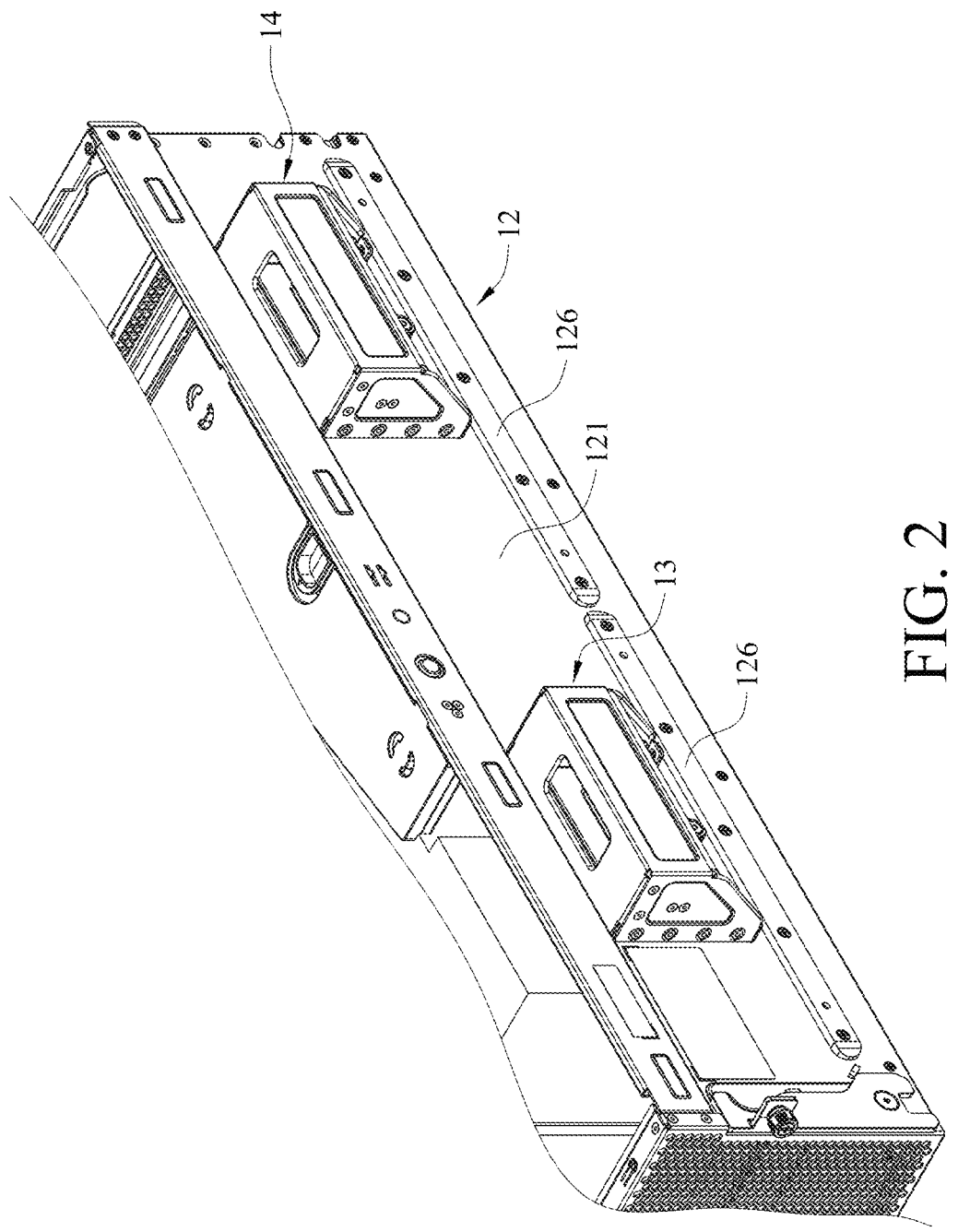
FIG. 2 is a partially enlarged perspective view of the server device in FIG. 1.
Figure 3:
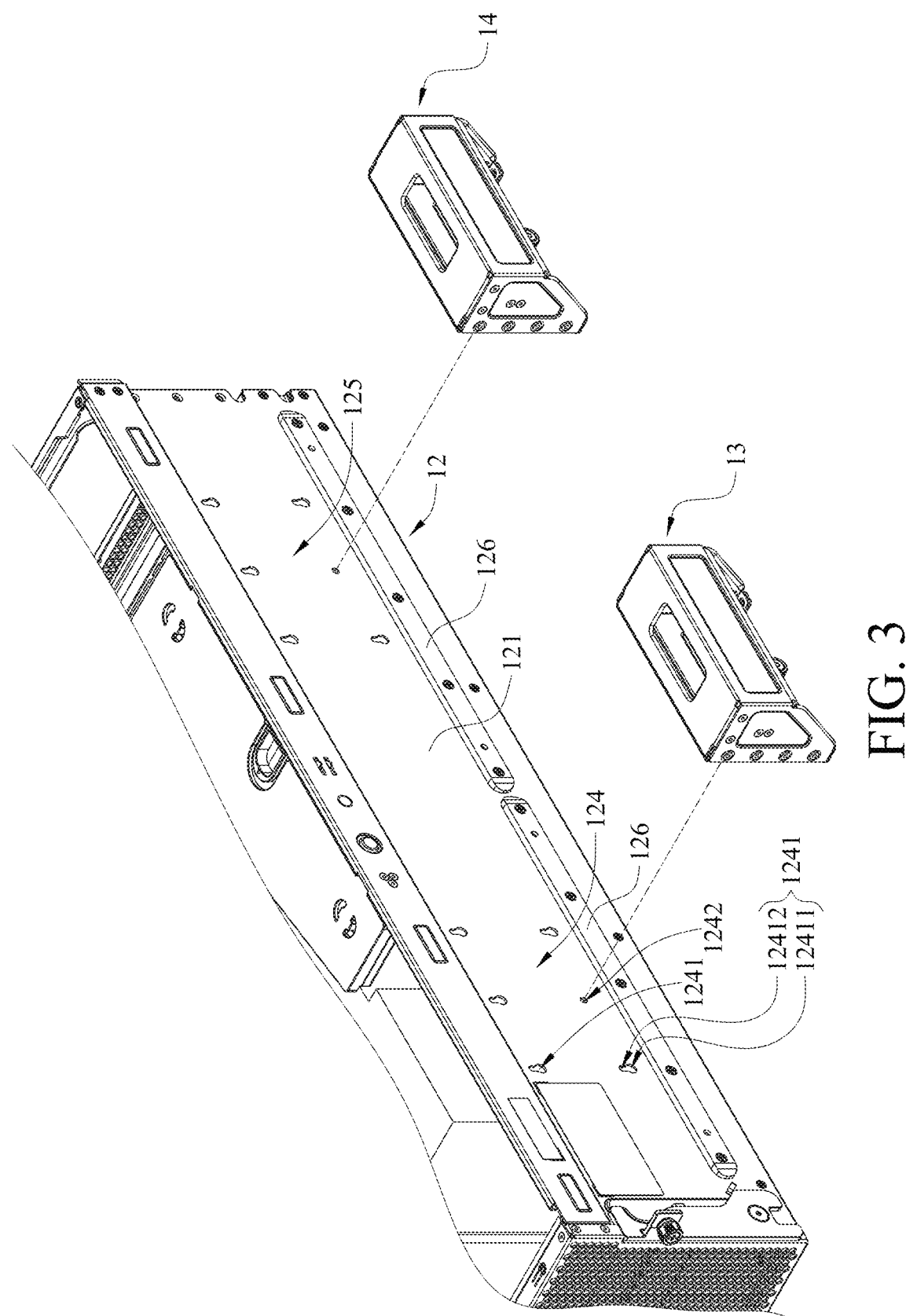
FIG. 3 is a partially enlarged and exploded view of the server device in FIG. 1.
Figure 4:
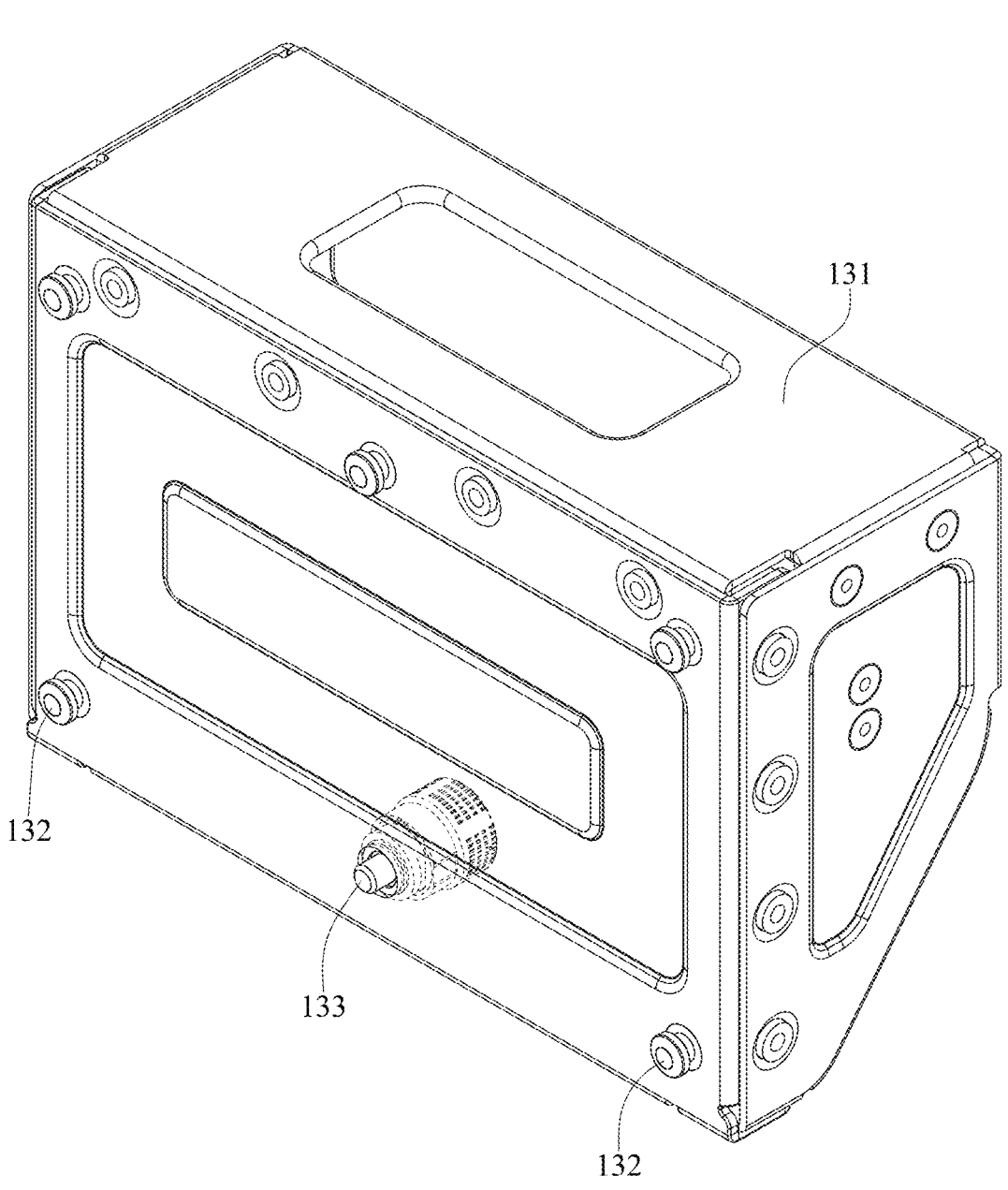
FIG. 4 is a perspective view of the first fixed handle of the server device in FIG. 1.
Figure 5:
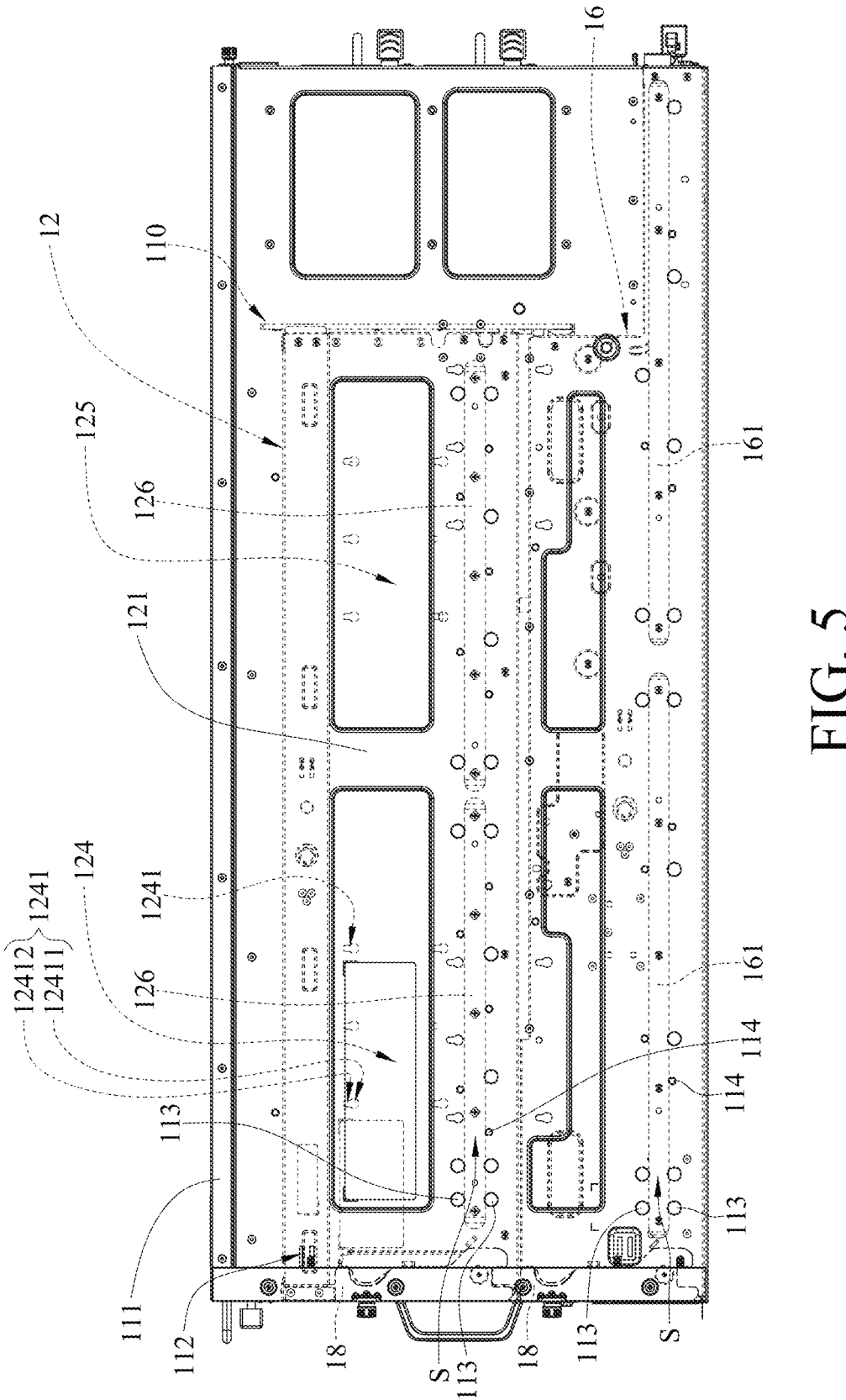
FIG. 5 is a side view of the server device in FIG. 1 without the fixed handles.

Please refer to FIG. 1 to FIG. 5, where FIG. 1 is an exploded view of a server device 10 without fixed handles 13 and 14 in accordance with an embodiment of the invention, FIG. 2 is a partially enlarged perspective view of the server device 10 in FIG. 1, FIG. 3 is a partially enlarged and exploded view of the server device 10 in FIG. 1, FIG. 4 is a perspective view of the first fixed handle 13 of the server device 10 in FIG. 1, and FIG. 5 is a side view of the server device 10 in FIG. 1 without the fixed handles 13 and 14.

In this embodiment, the server device 10 is, for example, an artificial intelligence server, and is applied to, for example, large-scale training, speech recognition, image classification or machine translation. The server device 10 includes a chassis 11, a graphics card assembly 12, a plurality of first fixed handles 13, a plurality of second fixed handles 14 and a plurality of spring sheets 15. A height of the chassis 11 is, for example, 8U, and a height of the graphics card assembly 12 is, for example, 4U. The graphics card assembly 12 is movably disposed in the chassis 11.

In detail, the graphics card assembly 12 can be moved relative to the chassis 11 to a first pre-removal position, a second pre-removal position and a removal position. A length that the graphics card assembly 12 is pulled out from the chassis 11 to the second pre-removal position is greater than a length that the graphics card assembly 12 is pulled out from the chassis 11 to the first pre-removal position. A length that the graphics card assembly 12 is pulled out from the chassis 11 to the removal position is greater than a length that the graphics card assembly 12 is pulled out from the chassis 11 to the second pre-removal position. The graphics card assembly 12 includes a first side plate 121, a second side plate 122, a front side plate 123, a plurality of first handle installation portions 124 and a plurality of second handle installation portions 125.

The first side plate 121 is located opposite to the second side plate 122. Two opposite sides of the front side plate 123 are connected to the first side plate 121 and the second side plate 122, respectively. The first handle installation portions 124 and the second handle installation portions 125 are located at the first side plate 121 and the second side plate 122. A distance between one of the first handle installation portions 124 and the front side plate 123 is, for example, less than a distance between one of the second handle installation portions 125 and the front side plate 123. That is, the first handle installation portions 124 are located closer to the outside of the chassis 11 than the second handle installation portions 125. The first fixed handles 13 and the second fixed handles 14 are detachably installed on the first handle installation portions 124 and the second handle installation portions 125, respectively.

The first handle installation portions 124 and the second handle installation portions 125 are located at the first side plate 121 and the second side plate 122 symmetrically. In addition, structures of the first handle installation portions 124 and the second handle installation portions 125 are the same, structures of the first side plate 121 and the second side plate 122 are the same, and structures of the first fixed handles 13 and the second fixed handles 14 are the same. Therefore, the following paragraphs merely specifically introduce the first handle installation portion 124 located at the first side plate 121 and the first fixed handle 13 installed on the first handle installation portion 124.

The first fixed handle 13 includes a handle main body 131, a plurality of installation pillars 132 and a positioning protrusion 133. The installation pillars 132 and the positioning protrusion 133 are disposed on the handle main body 131. The installation pillars 132 are, for example, T-shaped structures. The first handle installation portion 124 has a plurality of installation holes 1241 and a positioning hole 1242. The installation holes 1241 are, for example, pear-shaped holes. Each of the installation holes 1241 has a wider section 12411 and a narrower section 12412. The wider section 12411 is connected to the narrower section 12412. After the installation pillars 132 are installed in the wider sections 12411 and then moved to the narrower sections 12412, respectively, the positioning protrusion 133 is inserted into the positioning hole 1242, such that the first fixed handle 13 is detachably installed on the first handle installation portion 124.

Figure 6:
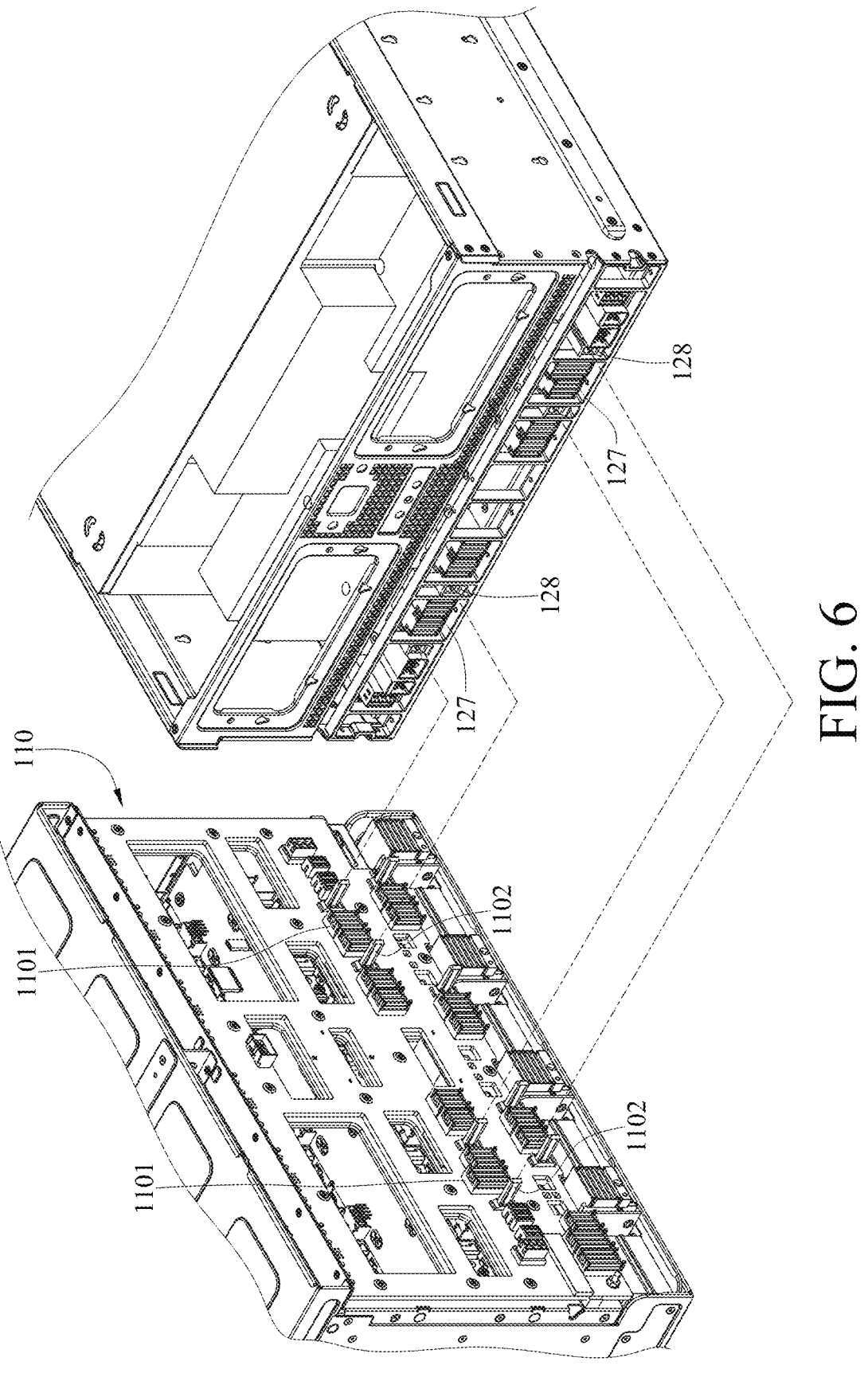
FIG. 6 is an exploded view of a graphics card assembly and a backplane of the server device in FIG. 1.
Figure 7:
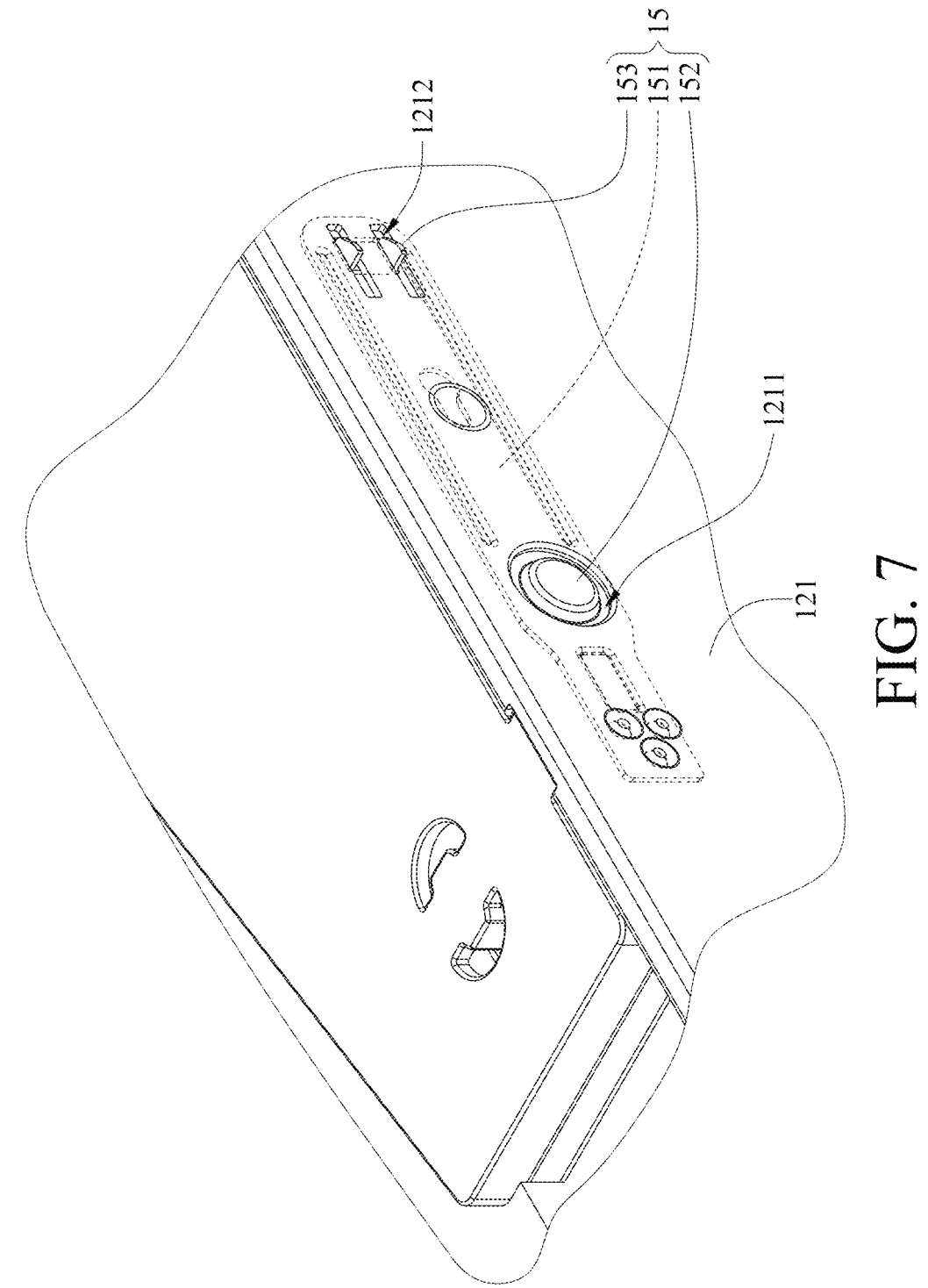
FIG. 7 is a partially enlarged perspective view of the graphics card assembly of the server device in FIG. 1.
Figure 8:
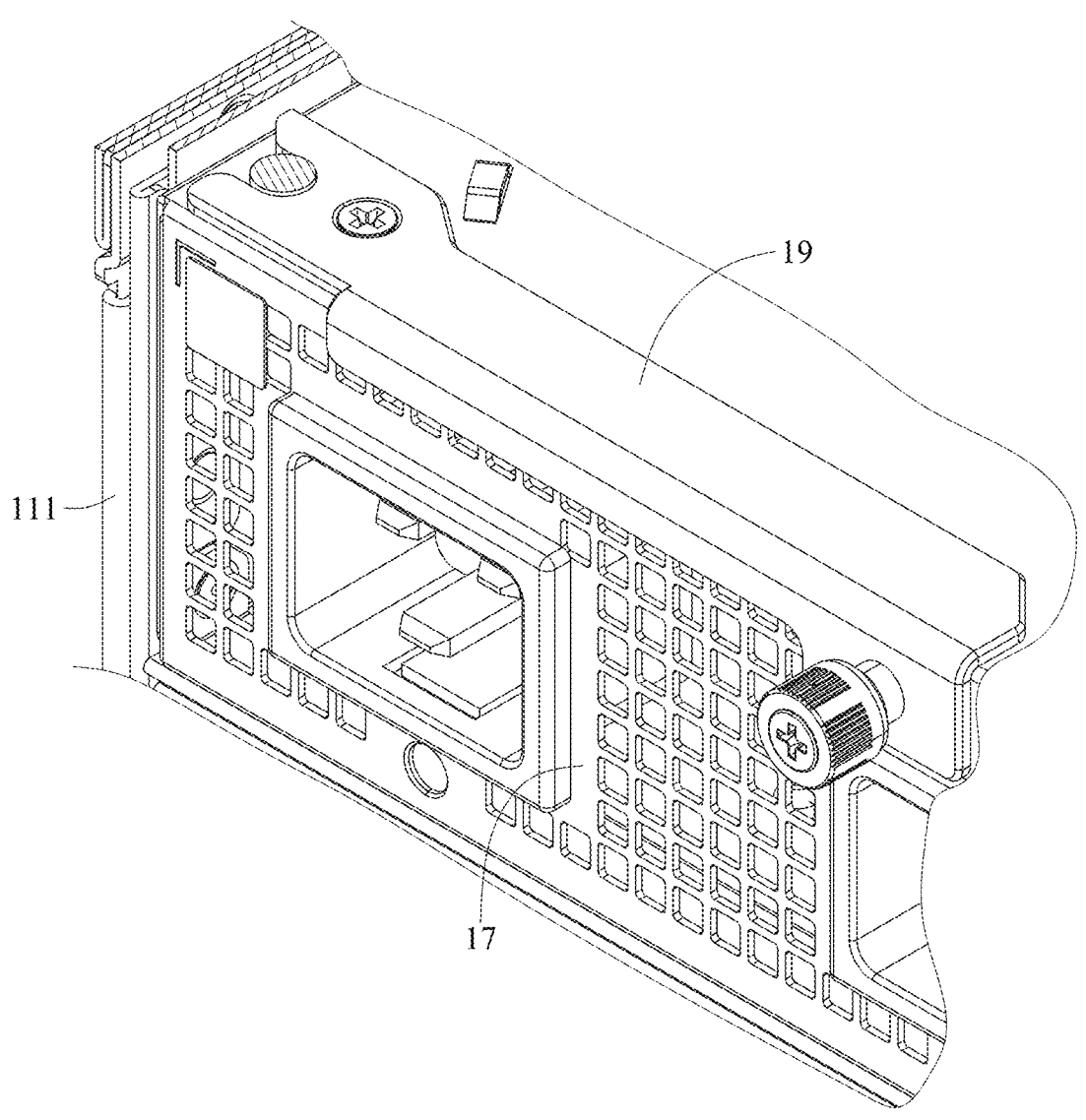
FIG. 8 is another partially enlarged perspective view of the server device in FIG. 1.

Please refer to FIG. 1 to FIG. 8, where FIG. 6 is an exploded view of the graphics card assembly 12 and a backplane 110 of the server device 10 in FIG. 1, FIG. 7 is a partially enlarged perspective view of the graphics card assembly 12 of the server device 10 in FIG. 1 and FIG. 8 is another partially enlarged perspective view of the server device 10 in FIG. 1.

The spring sheets 15 are disposed on one side of the first side plate 121 away from the chassis 11 and one side of the second side plate 122 away from the chassis 11, respectively. The spring sheets 15 are disposed at the first side plate 121 and the second side plate 122 symmetrically. In addition, structures of the spring sheets 15 are the same. Therefore, the spring sheet 15 disposed on the first side plate 121 will be merely specifically described below. The spring sheet 15 includes a spring sheet body 151, a pressing portion 152 and a first blocking portion 153. The first side plate 121 of the graphics card assembly 12 has an opening 1211 and a recess 1212. The pressing portion 152 is disposed on the spring sheet body 151, and is located in the opening 1211. The first blocking portion 153 is disposed on the spring sheet body 151, and is located in the recess 1212.

The chassis 11 includes a casing portion 111 and a plurality second blocking portions 112. The second blocking portions 112 are disposed on the casing portion 111. The spring sheets 15 are at least partially located between the first handle installation portions 124 and the second handle installation portions 125. When the graphics card assembly 12 is moved to the first pre-removal position, the first blocking portions 153 are blocked by the second blocking portions 112, respectively. At this moment, the first fixed handles 13 can be installed on the first handle installation portions 124, respectively. When the pressing portions 152 are pressed, the pressing portions 152 force the first blocking portions 153 to be released from the second blocking portion 112. Accordingly, the graphics card assembly 12 can be released from the first pre-removal position, and can be moved toward the second pre-removal position.

In this embodiment, the graphics card assembly 12 includes the first handle installation portions 124 and the second handle installation portions 125, and the first fixed handles 13 and the second fixed handles 14 are detachably disposed on the first handle installation portions 124 and the second handle installation portions 125, respectively. Therefore, the graphics card assembly 12 can be removed and installed more easily via the first fixed handles 13 disposed on the first handle installation portions 124 and the second fixed handles 14 disposed on the second handle installation portions 125 during the process of removal and installation of the graphics card assembly 12. In addition, the first fixed handles 13 and the second fixed handles 14 may not interfere with other components disposed in the chassis 11. Accordingly, the graphics card assembly 12 can be disposed in the chassis 11 more easily, thereby improving the convenience of removal and installation of the graphics card assembly 12.

In addition, the graphics card assembly 12 includes the spring sheets 15. Therefore, when the graphics card assembly 12 is moved to the first pre-removal position, the graphics card assembly 12 can be fixed in the first pre-removal position via the cooperation of the first blocking portions 153 of the spring sheets 15 and the second blocking portions 112 of the chassis 11. Accordingly, when the graphics card assembly 12 is pulled out of the chassis 11, the graphics card assembly 12 can be prevented from falling due to losing balance, thereby improving the convenience and the safety of the removal of the first fixed handles 13.

In this embodiment, the server device 10 may further include a processor assembly 16 and a power supply assembly 17. The processor assembly 16 and the power supply assembly 17 are movably disposed in the chassis 11. The graphics card assembly 12, the power supply assembly 17 and the processor assembly 16 are arranged vertically, and the graphics card assembly 12 and the processor assembly 16 are electrically connected to the power supply assembly 17. Accordingly, the power supply assembly 17 can supply power to the graphics card assembly 12 and the processor assembly 16.

In this embodiment, the server device 10 may further include a plurality of first movable handles 18 and a plurality of second movable handles 19. The first movable handles 18 are movably disposed on the graphics card assembly 12 and the processor assembly 16, respectively. Accordingly, the graphics card assembly 12 and the processor assembly 16 can be moved more easily via the first movable handles 18, for example, saving about 85% effort.

The second movable handles 19 are movably disposed on the power supply assembly 17. The second movable handles 19 are disposed on the power supply assembly 17 symmetrically. In addition, structures of the second movable handles 19 are the same. Therefore, only one second movable handle 19 will be specifically described below. When the second movable handle 19 is rotated, the second movable handle 19 contacts the casing portion 111 of the chassis 11 so as to force the power supply assembly 17 to be moved out of the chassis 11. Accordingly, the power supply assembly 17 can be moved more easily via the second movable handles 19, for example, saving about 85% effort.

In this embodiment, the chassis 11 may further includes a plurality of rollers 113 and a plurality of support pillars 114. The graphics card assembly 12 may further include a plurality of first sliding blocks 126. The processor assembly 16 may further include a plurality of second sliding blocks 161. The rollers 113 and the support pillars 114 are arranged side by side to together form a plurality of sliding portions S. The first sliding blocks 126 and the second sliding blocks 161 are slidably disposed in the sliding portions S, respectively, so that the graphics card assembly 12 and the processor assembly 16 can be moved in the chassis 11 more easily. In addition, the rollers 113 and the support pillars 114 may be further configured to support the graphics card assembly 12 and the processor assembly 16. The support pillars 114 may further be configured to position the first sliding blocks 126 and the second sliding blocks 161.

In addition, an arrangement density of the rollers 113 located close to the front side plate 123 is greater than an arrangement density of the rollers 113 located far away from the front side plate 123. Accordingly, when the graphics card assembly 12 and the processor assembly 16 are about to be completely removed from the chassis 11, the rollers 113 located close to the front side plate 123 can further support the graphics card assembly 12 and the processor assembly 16. That is, the graphics card assembly 12 and the processor assembly 16 can be further prevented from falling due to losing balance during the process of removal of the graphics card assembly 12 and the processor assembly 16.

In this embodiment, the server device 10 may further include a backplane 110. The backplane 110 is, for example, a circuit board. The backplane 110 is vertically disposed in the chassis 11, and include a plurality of first electrical connectors 1101 and a plurality of first guiding structures 1102. The graphics card assembly 12 may further include a plurality of second electrical connectors 127 and a plurality of second guiding structures 128. The first guiding structures 1102 are, for example, guiding protrusions, and the second guiding structures 128 are, for example, guiding recesses. The second electrical connectors 127 of the graphics card assembly 12 are electrically connected to the first electrical connectors 1101 of the backplane 110 in a board-to-board manner via the guidance of the first guiding structures 1102 and the second guiding structures 128. Accordingly, the power supply assembly 17 can supply power to the graphics card assembly 12 via the backplane 110.

In this embodiment, the graphics card assembly 12 includes the plurality of first handle installation portions 124, the plurality of second handle installation portions 125, the plurality of first fixed handles 13 and the plurality of second fixed handles 14, and the first handle installation portions 124 and the second handle installation portions 125 are located at the first side plate 121 and the second side plate 122, respectively, but the invention is not limited thereto. In other embodiments, the graphics card assembly may include only one first handle installation portions, only one second handle installation portions, only one first fixed handles and only one second fixed handles, and the first handle installation portion and the second handle installation portion are located at the first side plate or the second side plate.

In this embodiment, each of the first fixed handles 13 includes the installation pillars 132 and the positioning protrusion 133, and each of the first handle installation portions 124 has the installation holes 1241 and the positioning hole 1242, but the invention is not limited thereto. In other embodiments, each of the first fixed handles may has the installation holes and the positioning hole, and each of the first handle installation portions may include the installation pillars and the positioning protrusion.

In this embodiment, the server device 10 includes the plurality of spring sheets 15, and the spring sheets 15 are disposed at the first side plate 121 and the second side plate

122, respectively, but the invention is not limited thereto. In other embodiments, the server device may include only one spring sheet, and the spring sheet is disposed on the first side plate or the second side plate.

In this embodiment, the server device 10 includes the plurality of first movable handles 18 and the plurality of second movable handles 19, but the invention is not limited thereto. In other embodiments, the server device may include only one first movable handles and only one second movable handle merely.

In this embodiment, the graphics card assembly 12 includes the plurality of the first sliding blocks 126, and the processor assembly 16 includes the plurality of the second sliding blocks 161, but the invention is not limited thereto. In other embodiments, the graphics card assembly may include only one first slide, and the processor assembly may include only one second slide.

In this embodiment, the first guiding structures 1102 are guiding protrusions, and the second guiding structures 128 are guiding recesses, but the invention is not limited thereto. In other embodiments, configurations of the first guiding structures and configurations of the second guiding structures may be exchanged. That is, the first guiding structures may be guiding recesses, and the second guiding structures may be guiding protrusions.

Figure 9:
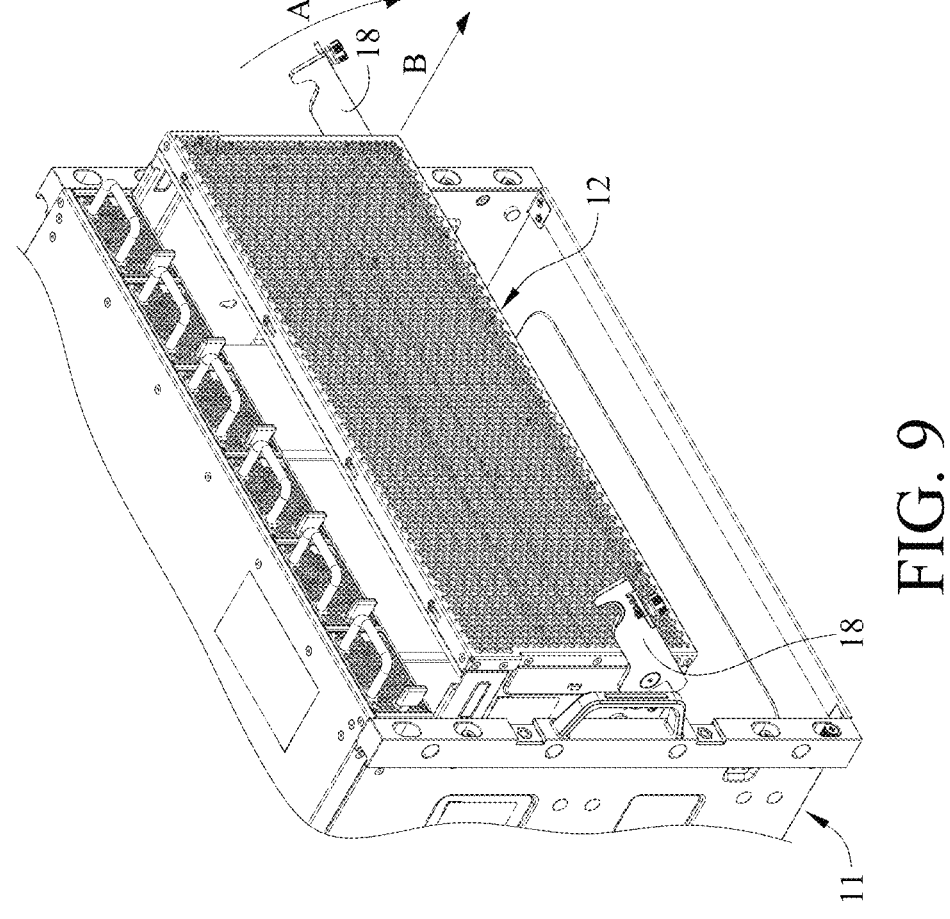
FIG. 9 is a partially enlarged perspective view showing that first movable handles of the server device in FIG. 1 are rotated.
Figure 10:
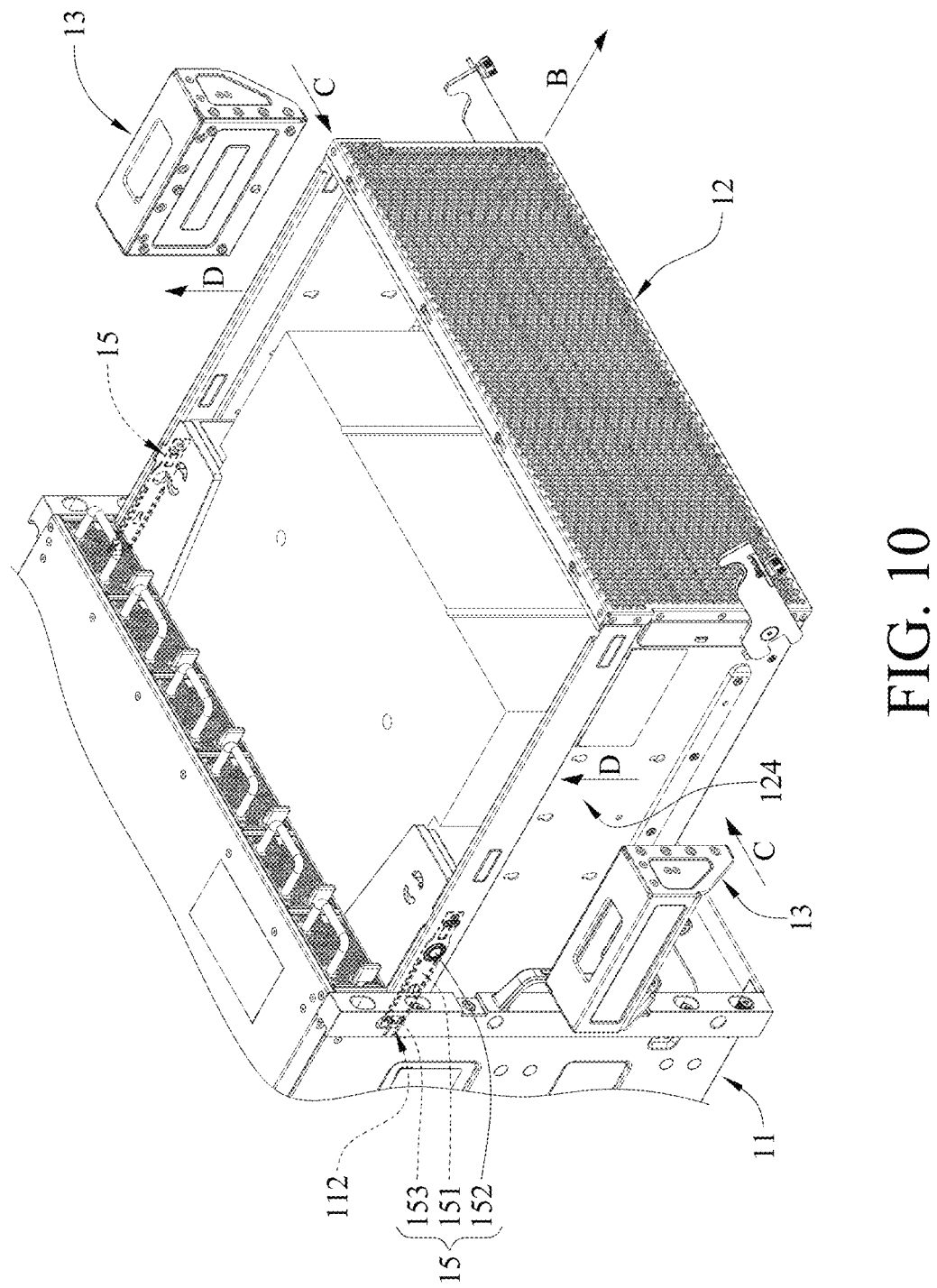
FIG. 10 is a partially enlarged perspective view showing that first fixed handles of the server device are installed on first handle installation portions of the server device in FIG. 1.
Figure 11:
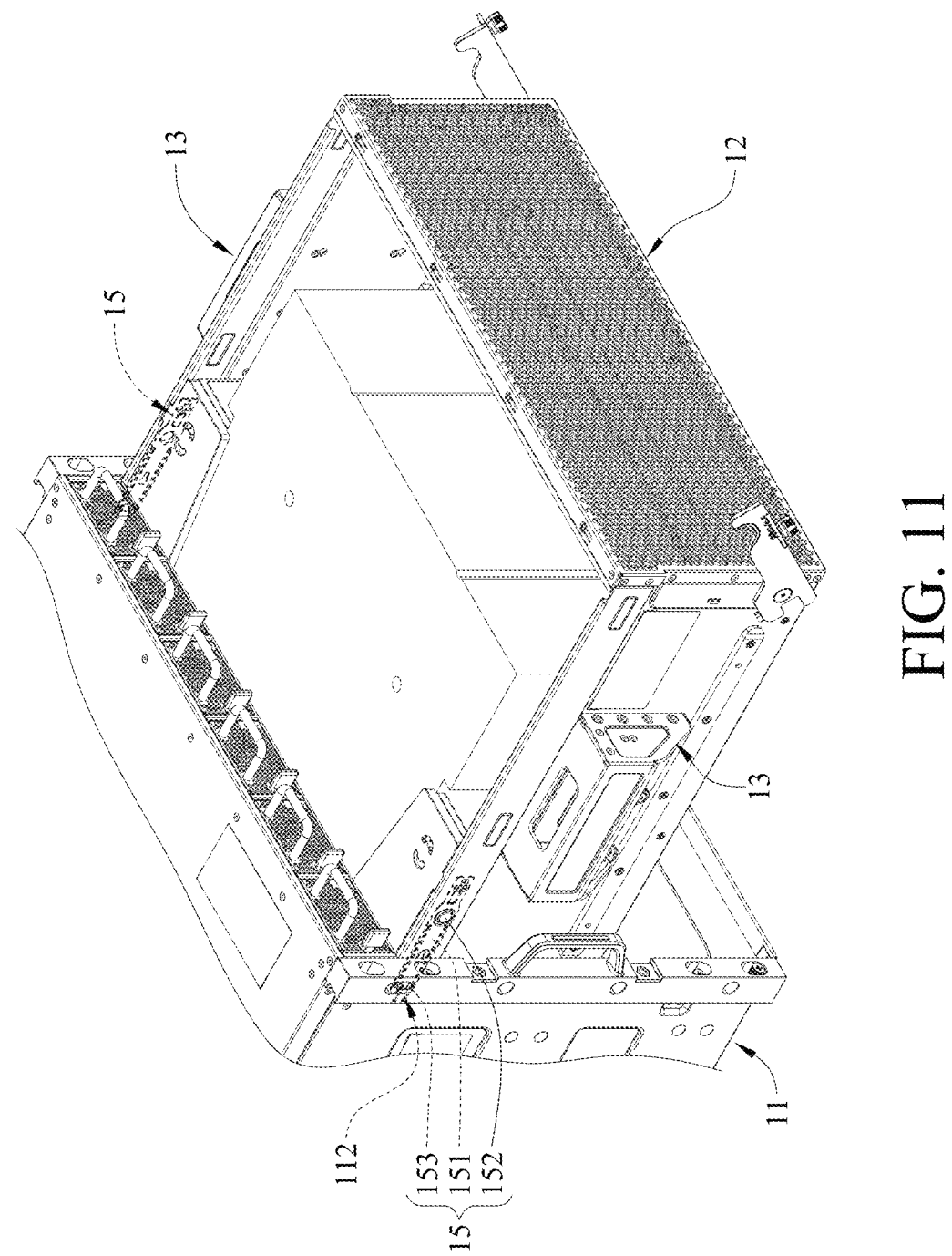
FIG. 11 is a partially enlarged perspective view showing that first blocking portions of the server device are released from second blocking portions of the server device in FIG. 1.
Figure 12:
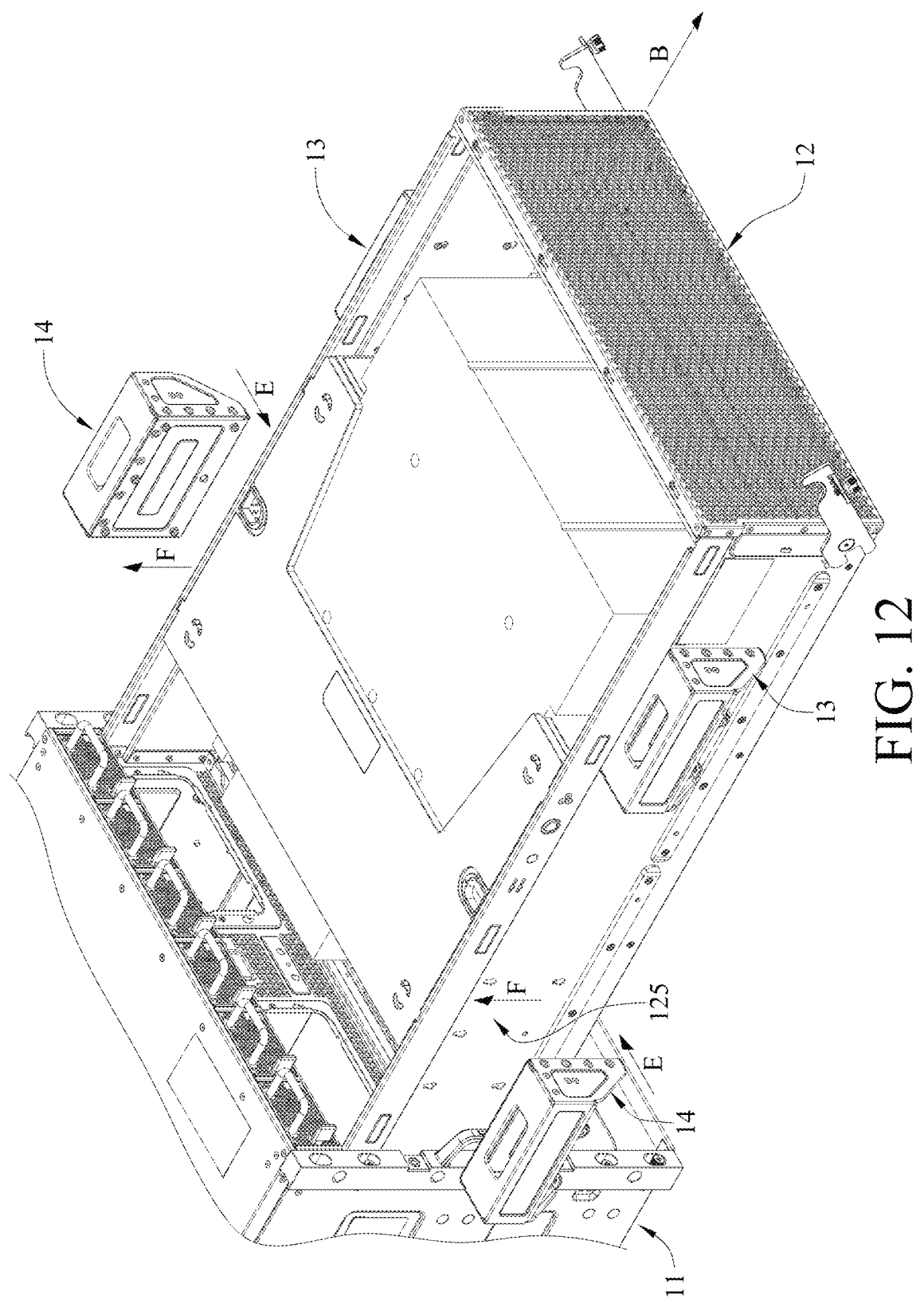
FIG. 12 is a partially enlarged perspective view showing that second fixed handles of the server device are installed on second handle installation portions of the server device in FIG. 1.

Please refer to FIG. 9 to FIG. 12, where FIG. 9 is a partially enlarged perspective view showing that the first movable handles 18 of the server device 10 in FIG. 1 are rotated, FIG. 10 is a partially enlarged perspective view showing that the first fixed handles 13 of the server device 10 are installed on the first handle installation portions 124 of the server device 10 in FIG. 1, FIG. 11 is a partially enlarged perspective view showing that the first blocking portions 153 of the server device 10 are released from the second blocking portions 112 of the server device 10 in FIG. 1, and FIG. 12 is a partially enlarged perspective view showing that the second fixed handles 14 of the server device 10 are installed on the second handle installation portions 125 of the server device 10 in FIG. 1.

When the graphics card assembly 12 needs to be removed from the chassis 11, as shown in FIG. 9, the first movable handles 18 are rotated along a direction A in advance, so that the graphics card assembly 12 can be moved along a direction B more easily. Then, as shown in FIG. 10 and FIG. 11, the graphics card assembly 12 is moved to the first pre-removal position along the direction B. At this moment, the graphics card assembly 12 is fixed in the first pre-removal position via the cooperation of the first blocking portions 153 of the spring sheets 15 and the second blocking portions 112 of the chassis 11. Then, the first fixed handles 13 are installed on the first handle installation portions 124 of the graphics card assembly 12 along a direction C and a direction D, respectively.

Then, as shown in FIG. 12, the pressing portions 152 of the spring sheets 15 are pressed, such that the pressing portions 152 force the first blocking portions 153 to release from the second blocking portion 112 via the spring sheet bodies 151. Thus, the graphics card assembly 12 can be released from the first pre-removal position. Then, the graphics card assembly 12 is further moved from the first pre-removal position to the second pre-removal position along the direction B, and the second fixed handles 14 are installed on the second handle installation portions 125 of the graphics card assembly 12 along a direction E and a direction F, respectively. Then, the graphics card assembly 12 is further moved from the second pre-removal position to the removal position along the direction B. Accordingly, the graphics card assembly 12 can be removed from the chassis 11.

On the contrary, when the graphics card assembly 12 needs to be installed in the chassis 11, the graphics card assembly 12 can be installed via the steps described below merely. Firstly, the second fixed handles 14 are removed from the second handle installation portions 125 of the graphics card assembly 12 along a direction opposite to the direction E and a direction opposite to the direction F, respectively, and the first fixed handles 13 are removed from the first handle installation portions 124 of the graphics card assembly 12 along a direction opposite to the direction C and a direction opposite to the direction D, respectively. Then, the graphics card assembly 12 is moved into the chassis 11 along a direction opposite to the direction B. Then, the first movable handles 18 are rotated along a direction opposite to the direction A. Accordingly, the graphics card assembly 12 can be installed in the chassis 11. When the graphics card assembly 12 is moved into the chassis 11 along a direction opposite to the direction B, the first blocking portions 153 of the spring sheets 15 may not be blocked by the second blocking portions 112 of the chassis 11 since the first blocking portions 153 are provided with guiding inclined surfaces, respectively.

Please refer to FIG. 13 to FIG. 16, where FIG. 13 is a flow chart of a removal method of graphics card assembly in accordance with an embodiment of the invention, FIG. 14 is a flow chart of a step S100 of pulling the graphics card assembly out of the chassis to a first pre-removal position of the removal method of graphics card assembly in FIG. 13, FIG. 15 is a flow chart of a step S300 of pulling the graphics card assembly out of the chassis from the first pre-removal position to a removal position of the removal method of graphics card assembly in FIG. 13, and FIG. 16 is a flow chart of a step S302 of keeping pulling the graphics card assembly out of the chassis to the removal position of the removal method of graphics card assembly in FIG. 15.

Exemplary steps of the removal method of graphics card assembly according to this embodiment are described hereinbelow. When the graphics card assembly needs to be removed from the chassis, the step S100 is performed to pull the graphics card assembly out of the chassis to the first pre-removal position. In detail, the step S100 includes steps S101 and S102. The step S101 is to pull the graphics card assembly out of the chassis. Next, the step S102 is performed to position the graphics card assembly at the first pre-removal position via the cooperation of the first blocking portions of the spring sheets of the graphics card assembly and the second blocking portions of the chassis.

Next, the step S200 is performed to install the first fixed handles on the first handle installation portions of the graphics card assembly. Next, the step S300 is performed to pull the graphics card assembly out of the chassis from the first pre-removal position to the removal position. In detail, the step S300 includes steps S301 and S302. The step S301 is performed to release the first blocking portions of the spring sheets of the graphics card assembly from the second blocking portions of the chassis. Next, the step S302 is performed to keep pulling the graphics card assembly out of the chassis to the removal position.

Furthermore, the step S302 includes steps S3021 to S3023. The step S3021 is performed to pull the graphics card assembly out of the chassis to a second pre-removal position. Next, the step S3022 is performed to install the second fixed handles on the second handle installation portions of the graphics card assembly. Next, the step S3023 is performed to pull the graphics card assembly out of the removal position. Accordingly, the graphics card assembly can be removed from the chassis.

According to the server device and the removal method of graphics card assembly disclosed by the above embodiments, the graphics card assembly includes the first handle installation portions and the second handle installation portions, and the first fixed handles and the second fixed handles are detachably disposed on the first handle installation portions and the second handle installation portions, respectively. Therefore, the graphics card assembly can be removed and installed more easily via the first fixed handles disposed on the first handle installation portions and the second fixed handles disposed on the second handle installation portions during the process of removal and installation of the graphics card assembly. In addition, the first fixed handles and the second fixed handles may not interfere with other components disposed in the chassis. Accordingly, the graphics card assembly can be disposed in the chassis more easily, thereby improving the convenience of removal and installation of the graphics card assembly.

In addition, the graphics card assembly includes the spring sheets. Therefore, when the graphics card assembly is moved to the first pre-removal position, the graphics card assembly can be fixed in the first pre-removal position via the cooperation of the first blocking portions of the spring sheets and the second blocking portions of the chassis. Accordingly, when the graphics card assembly is pulled out of the chassis, the graphics card assembly can be prevented from falling due to losing balance, thereby improving the convenience and the safety of the removal of the first fixed handles.

It will be apparent to those skilled in the art that various modifications and variations can be made to the invention. It is intended that the specification and examples be considered as exemplary embodiments only, with the scope of the invention being indicated by the following claims.

What is claimed is:

1. A server device, comprising: a chassis; and a graphics card assembly, movably disposed in the chassis and comprising a first side plate, a second side plate and at least one first handle installation portion, wherein the first side plate is located opposite to the second side plate, and the at least one first handle installation portion is located at the first side plate; and at least one first fixed handle, wherein the at least one first fixed handle comprises a handle main body, a plurality of installation pillars and a positioning protrusion, the plurality of installation pillars and the positioning protrusion are disposed on the handle main body, the at least one first handle installation portion has a plurality of installation holes and a positioning hole, each of the plurality of installation holes has a wider section and a narrower section, the wider section is connected to the narrower section, after the plurality of installation pillars are installed in the plurality of wider sections and then moved up to the plurality of narrower sections, respectively, the positioning protrusion is inserted into the positioning hole, and the at least one first fixed handle is be detachably installed on the at least one first handle installation portion by a user to lift the graphics card assembly; and at least one spring sheet, wherein the at least one spring sheet is disposed on one side of the first side plate away from the chassis, the at least one spring sheet comprises a spring sheet body, a pressing portion and at least one first blocking portion, the graphics card assembly has an opening and at least one recess, the pressing portion is disposed on the spring sheet body and located in the opening, the at least one first blocking portion is disposed on the spring sheet body and located in the at least one recess, the chassis comprises a casing portion and at least one second blocking portion, the at least one second blocking portion is disposed on the casing portion, when the at least one first blocking portion is blocked by the at least one second blocking portion, the at least one first fixed handle is installed on the at least one first handle installation portion, when the pressing portion is pressed, the pressing portion forces the at least one first blocking portion to be released from the at least one second blocking portion.

2. The server device according to claim 1, further comprising at least one second fixed handle, wherein the graphics card assembly further comprises a front side plate and at least one second handle installation portion, two opposite sides of the front side plate are connected to the first side plate and the second side plate, respectively, the at least one first handle installation portion and the at least one second handle installation portion are located at the first side plate, a distance between the at least one first handle installation portion and the front side plate is different from a distance between the at least one second handle installation portion and the front side plate, the at least one first fixed handle and the at least one second fixed handle are detachably installed on the at least one first handle installation portion and the at least one second handle installation portion, respectively, the at least one spring sheet is at least partially located between the at least one first handle installation portion and the at least one second handle installation portion.

3. The server device according to claim 1, further comprising a power supply assembly, wherein the power supply assembly is movably disposed in the chassis, the graphics card assembly and the power supply assembly are arranged vertically, and the graphics card assembly is electrically connected to the power supply assembly.

4. The server device according to claim 3, further comprising a processor assembly, wherein the processor assembly is movably disposed in the chassis, the graphics card assembly, the power supply assembly and the processor assembly are arranged vertically, and the graphics card assembly and the processor assembly are electrically connected to the power supply assembly.

5. The server device according to claim 4, further comprising a plurality of first movable handles and at least one second movable handle, wherein the plurality of first movable handles are movably disposed on the graphics card assembly and the processor assembly, respectively, and the at least one second movable handle is movably disposed on the power supply assembly.

6. The server device according to claim 4, wherein the chassis comprises a plurality of rollers and a plurality of support pillars, the graphics card assembly comprises at least one first sliding block, the processor assembly comprises at least one second sliding block, the plurality of rollers and the plurality of support pillars are arranged side by side to together form a plurality of sliding portions, the at least one first sliding block and the at least one second sliding block are slidably disposed in the plurality of sliding portions, respectively.

7. A removal method of graphics card assembly, comprising: pulling a graphics card assembly out of a chassis to a first pre-removal position; installing at least one first fixed handle on at least one first handle installation portion of the graphics card assembly; and pulling the graphics card assembly out of the chassis from the first pre-removal position to a removal position; and the step of pulling the graphics card assembly out of the chassis to the first pre-removal position further comprises: pulling the graphics card assembly out the chassis; and positioning the graphics card assembly in the first pre-removal position via at least one first blocking portion of at least one spring sheet of the graphics card assembly blocked by at least one second blocking portion of the chassis; and wherein the step of pulling the graphics card assembly out of the chassis from the first pre-removal position to the removal position further comprises: releasing the at least one first blocking portion of the at least one spring sheet of the graphics card assembly from the at least one second blocking portion of the chassis; and keeping pulling the graphics card assembly out of the chassis to the removal position; and wherein the step of keeping pulling the graphics card assembly out of the chassis to the removal position further comprises: pulling the graphics card assembly out of the chassis to a second pre-removal position; installing at least one second fixed handle on at least one second handle installation portion of the graphics card assembly; and pulling the graphics card assembly out of the removal position.

* * * * *